United States Patent [19]

Hickox et al.

[11] Patent Number: 4,833,509
[45] Date of Patent: May 23, 1989

[54] INTEGRATED CIRCUIT REFERENCE DIODE AND FABRICATION METHOD THEREFOR

[75] Inventors: Robert E. Hickox; William R. Edwards, III, both of Tucson, Ariz.

[73] Assignee: Burr-Brown Corporation, Tucson, Ariz.

[21] Appl. No.: 547,103

[22] Filed: Oct. 31, 1983

[51] Int. Cl.⁴ ............................................. H01L 29/88
[52] U.S. Cl. ........................................ 357/13; 357/35; 357/89; 357/90; 357/52
[58] Field of Search ....................... 357/13, 35, 89, 90, 357/52

[56] References Cited

U.S. PATENT DOCUMENTS

| | | | |
|---|---|---|---|
| 3,497,776 | 2/1970 | Philips | 357/13 |
| 3,886,001 | 5/1975 | Dobkin | 357/20 |
| 3,909,119 | 9/1975 | Wolley | 357/13 |
| 4,213,806 | 7/1980 | Tsang | 357/90 |
| 4,484,206 | 11/1984 | Moroshima et al. | 357/13 |

FOREIGN PATENT DOCUMENTS 55-85077 6/1980 Japan .................. 357/52

Primary Examiner—Martin H. Edlow
Attorney, Agent, or Firm—Harry M. Weiss

[57] ABSTRACT

This disclosure is a integrated circuit reference diode having improved manufacturability and electrical characteristics. The improved diode results from a structure and process which both reduces the subsurface breakdown and enhances the surface breakdown.

1 Claim, 1 Drawing Sheet

INTEGRATED CIRCUIT REFERENCE DIODE AND FABRICATION METHOD THEREFOR

BACKGROUND OF THE INVENTION

1. Field of the Invention

This invention relates generally to an improved zener or reference diode and fabrication method therefor for integrated circuits and, more specifically, to an integrated reference diode having a subsurface breakdown over a larger range of working currents and reduced sensitivity to both intended and random process variations.

2. Brief Description of the Prior Art

In the past, integrated circuit diodes having controlled breakdown voltages have been fabricated with the processes used for forming and isolating transistor elements required by the circuit. Examples of such diodes may be found in the Dobksin U.S. Pat. 3,886,001 and the Tsang U.S. Pat. No. 4,213,806. Such diodes suffered from two significant limitations. First, since the diodes were formed by substantially the same process steps used for the transistor devices in the integrated circuit, a change in the process to modify the transistor characteristics could undesirably impact the diode characteristics. Second, process variations within normal limits could result in unacceptable diode characteristics, such as insufficient dynamic range, excess noise, poor control over impedance, and the like.

Thus, a need existed to provide a diode structure and process which both resulted in better diode characteristics and reduced the sensitivity to intentional and unintentional process variations. Specifically, a need existed to provide a diode structure for operation in the reverse or breakdown mode whereby bulk breakdown characteristics can be obtained over a reasonable range of variation of process parameters.

SUMMARY OF THE INVENTION

In accordance with one embodiment of this invention, it is an object of this invention to provide an improved device configuration for a reverse-operated diode whereby improved electrical characteristics are provided.

It is yet another object of this invention to provide an integrated circuit diode which is less susceptible to surface breakdown.

It is still another object of this invention to provide a structure and process for fabrication of an integrated circuit diode for operation in the reverse-breakdown mode whereby the characteristics of the diode are relatively insensitive to variations in the processes used to fabricate the integrated circuit.

The foregoing and other objects, features and advantages of this invention will be apparent from the following more particular description of the preferred embodiments of the invention as illustrated in the accompanying drawings.

THE SPECIFICATION

Figure 1:
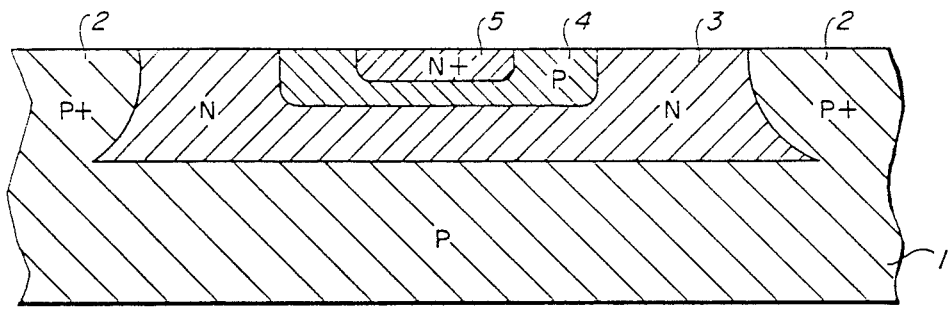
FIG. 1 is a cross-sectional side elevational view of a prior-art integrated circuit reference diode.

Referring to FIG. 1, one embodiment of a known diode for reverse operation in an integrated circuit is shown. In accordance with the usual practice in a PN junction-isolated integrated circuit, the structure is built up by a series of fabrication steps starting with a lightly-doped P type substrate region 1 covered with a lightly-doped N type epitaxial layer 3. Diffused or implanted regions 2 of P+ conductivity type serve to mutually isolate a plurality (not shown) of N type regions 3.

Again with reference to FIG. 1, a P region 4 is provided by diffusion and or ion implantation into N type region 3, and N+ region 5 is similarly provided in P region 4. The N+, P and N regions 5, 4 and 3 may comprise an NPN transistor, but at least a relatively-low voltage reference diode is provided by the PN junction formed by the connecting boundary of N+ region 5 and P region 4. Connections to the diode are by way of making ohmic (low resistance) electrical contacts to regions 4 and 5. Since the breakdown voltage of such a PN junction decreases as the carrier concentrations adjacent the junction increase, the breakdown voltage in this case will be determined by the surface concentrations of the implanted or diffused regions so that breakdown will initially take place in a limited area near the surface and then gradually spread into the subsurface portion of the junction as a higher voltage is applied. Thus, the impedance of the diode in breakdown is not particularly constant, and the value of the voltage breakdown is determined to a great extent by the parameters desired for the simultaneously fabricated NPN transistor.

Figure 2:
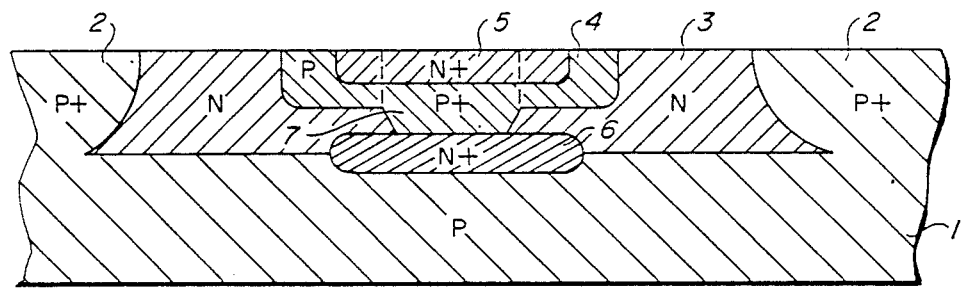
FIG. 2 is a cross-sectional side elevational view of another prior art embodiment of an integrated circuit reference diode.

Another prior art approach to an integrated circuit reference diode is illustrated in FIG. 2. The structure of FIG. 2 is similar to that of FIG. 1, with two additions. First, a heavily-doped buried N+ region 6 is provided between the P— substrate 1 and the N epitaxial layer 3. Second, an additional P+ region 7 is provided by the same doping step which forms the regions 2. If the doping in P+ region 7 is higher than that in P region 4, breakdown may take place at the junction comprising P+ region 7 and the underside of N+ region 5. Since the doping concentration used to form P+ regions 2 and 7 is generally substantially higher than that used for P region 4, subsurface breakdown will occur as long as the concentration in the N+ region 5 does not fall off too rapidly with distance into the substrate. However, if P region 4 is too heavily doped at the surface—as might occur by normal process variations or by the need for a heavily doped base region in the simultaneously-formed NPN transistors—then reverse conduction will initiate at the surface at the PN junction formed by P region 4 and N+ region 5.

In particular, breakdown may take place in three regions of this prior art type device as the current is increased—first at the surface corners of the device, then at the surface edges, and finally at the central subsurface portion. Such a condition will be reflected as a varying impedance in breakdown because the effective series resistance will be reduced as the operating current is increased. Thus the reference diode of FIG. 2 is subject to variations in breakdown voltage as a result of processing variations and exhibits undesirable electrical characteristics.

Figure 3:
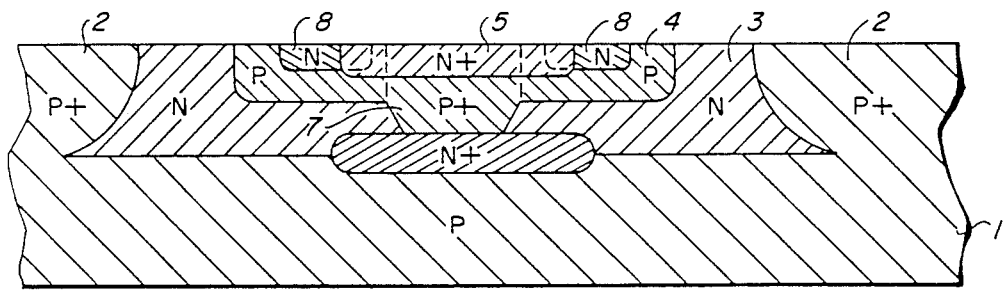
FIG. 3 is a cross-sectional side elevational view of an improved integrated circuit reference diode according to the present invention.

Referring now to FIG. 3, there is illustrated an improved reference diode configuration in accordance with a preferred embodiment of the present invention.

In this embodiment, the elements of FIG. 2 are supplemented by an additional N type region 8 which is located within the P region 4 and surrounds the N+ region 5 and thus is around the periphery of this PN junction between P region 4 and N+ region 5 at the surface. Additionally, the doping of the N region 8 is less than that of N+ region 5 and preferably intermediate to the dopings in N+ region 5 and P region 4. This raises the breakdown voltage at the surface corners and edges to ensure that it is substantially higher than the breakdown voltage of the central subsurface PN junction portion formed by N+ region 5 and P+ region 7. The breakdown voltage is now more controllable, and the impedance and noise are reduced because of the tendency to bulk breakdown.

By way of specificity, P region 4 desirably has a surface concentration in the range of $10^{18}$ doping atoms per cubic centimeter is derived from a diffusion or an ion-implantation. The N+ region 5 desirably has a surface concentration in the range of $10^{20}$ atoms per cubic centimeter, so that the surface breakdown voltage is less than about 7 volts, for example. Because of the criticality of the doping in N region 8, it is best derived from ion implantation. An ion implant dose in the range of $10^{13}$ to $10^{14}$ ions per square centimeter is sufficient to overdope the P type region 4 at the surface and yet result in a lower surface concentration than that of the N+ region 5.

In this way, the surface breakdown voltage is raised substantially above 7 volts, yielding a reference diode with good manufacturability and improved electrical characteristics as hereinbefore described. It is to be noted that, if desired, the conductivity types could be reversed in order to provide a reference diode of opposite polarity.

While the invention has been particularly shown and described with reference to preferred embodiments thereof, it will be understood by those skilled in the art that the foregoing and other changes in form and details may be made therein without departing from the spirit and scope of the invention.

We claim:

1. A reference diode for use in an integrated circuit substrate region having a major surface comprising in combination:

a first region of a first conductivity type located in said substrate region and extending to said major surface;

a first region of a second conductivity type located in said first region of said first conductivity type and extending to said major surface;

a second region of said first conductivity located within the boundaries of and having a greater doping concentration than said first region of said first conductivity type, said second region being located below and centrally of said first region of second conductivity type; and a second region of said second conductivity type in contact with both said first region of first conductivity type and said first region of said second conductivity type at said surface, said first region of said second conductivity type extending further into said substrate region than said second region of said second conductivity type, and said second region of said second conductivity type having a doping concentration less than that of said first region of said second conductivity type at said surface, and said second region of said second conductivity type has a total doping in the range of about $10^{13}$ to about $10^{14}$ ions per square centimeter.

* * * * *